(12) United States Patent
Yoshikawa et al.

(10) Patent No.: US 8,753,786 B2
(45) Date of Patent: Jun. 17, 2014

(54) LIGHT PATTERN EXPOSURE METHOD, HALFTONE PHASE SHIFT MASK, AND HALFTONE PHASE SHIFT MASK BLANK

(71) Applicants: Shin-Etsu Chemical Co., Ltd., Tokyo (JP); Toppan Printing Co., Ltd., Tokyo (JP)

(72) Inventors: Hiroki Yoshikawa, Joetsu (JP); Yukio Inazuki, Joetsu (JP); Ryuji Koitabashi, Joetsu (JP); Hideo Kaneko, Joetsu (JP); Yosuke Kojima, Tokyo (JP); Takashi Haraguchi, Tokyo (JP); Tomohito Hirose, Tokyo (JP)

(73) Assignees: Shin-Etsu Chemical Co., Ltd., Tokyo (JP); Toppan Printing Co., Ltd., Tokyo (JP)

( * ) Notice: Subject to any disclaimer, the term of this patent is extended or adjusted under 35 U.S.C. 154(b) by 60 days.

(21) Appl. No.: 13/682,188

(22) Filed: Nov. 20, 2012

(65) Prior Publication Data
US 2013/0130159 A1 May 23, 2013

(30) Foreign Application Priority Data
Nov. 21, 2011 (JP) .................................. 2011-253743

(51) Int. Cl.
*G03F 1/26* (2012.01)
*G03F 1/32* (2012.01)

(52) U.S. Cl.
USPC .......................................................... 430/5

(58) Field of Classification Search
USPC .......... 430/5, 322, 323, 324; 378/35; 428/428, 428/432
See application file for complete search history.

(56) References Cited

U.S. PATENT DOCUMENTS

| | | |
|---|---|---|
| 5,474,864 A | 12/1995 | Isao et al. |
| 7,179,545 B2 | 2/2007 | Okazaki et al. |
| 7,767,366 B2 | 8/2010 | Yoshikawa et al. |
| 7,771,893 B2 | 8/2010 | Yoshikawa et al. |
| 7,941,767 B2 | 5/2011 | Mukai et al. |
| 2010/0167185 A1 | 7/2010 | Suzuki et al. |
| 2012/0064438 A1* | 3/2012 | Yoshikawa et al. ............... 430/5 |

FOREIGN PATENT DOCUMENTS

| | | |
|---|---|---|
| DE | 102009060677 A1 | 8/2010 |
| JP | 4-125642 A | 4/1992 |
| JP | 7-140635 A | 6/1995 |
| JP | 7-181664 A | 7/1995 |

(Continued)

OTHER PUBLICATIONS

Faure et al., "Characterization of Binary and Attenuated Phase Shift Mask Blanks for 32nm Mask Fabrication", Photomask Technology, Proc. of SPIE, vol. 7122, 2008, pp. 712209-1 to 712209-12.

*Primary Examiner* — Stephen Rosasco
(74) *Attorney, Agent, or Firm* — Birch, Stewart, Kolasch & Birch, LLP

(57) ABSTRACT

A light pattern exposure method is by irradiating ArF excimer laser light to a resist film through a halftone phase shift mask. The mask includes a transparent substrate and a pattern of halftone phase shift film of a material comprising a transition metal, silicon, nitrogen and oxygen and having an atomic ratio (Met/Si) of 0.18-0.25, a nitrogen content of 25-50 atom %, and an oxygen content of 5-20 atom %. The mask may be irradiated with ArF excimer laser light in a cumulative dose of at least 10 $kJ/cm^2$.

9 Claims, 2 Drawing Sheets

(56) References Cited

FOREIGN PATENT DOCUMENTS

| JP | 10-171096 A | 6/1998 |
| JP | 2004-133029 A | 4/2004 |
| JP | 2007-33469 A | 2/2007 |
| JP | 2007-233179 A | 9/2007 |
| JP | 2007-241065 A | 9/2007 |
| JP | 2008-276002 A | 11/2008 |
| JP | 2010-156880 A | 7/2010 |
| KR | 10-2010-0080413 A | 7/2010 |

* cited by examiner

LIGHT PATTERN EXPOSURE METHOD, HALFTONE PHASE SHIFT MASK, AND HALFTONE PHASE SHIFT MASK BLANK

CROSS-REFERENCE TO RELATED APPLICATION

This non-provisional application claims priority under 35 U.S.C. §119(a) on Patent Application No. 2011-253743 filed in Japan on Nov. 21, 2011, the entire contents of which are hereby incorporated by reference.

TECHNICAL FIELD

This invention relates to a light pattern exposure method using a photomask, as applied in the microfabrication of semiconductor integrated circuits. It also relates to a halftone phase shift mask blank and a halftone phase shift mask prepared from the blank.

BACKGROUND ART

While semiconductor integrated circuits are used in a wide variety of applications, an increasingly finer circuit design is required for such goals as a higher density of integration and a saving of power consumption. In liaison with the demand, the circuit-forming lithography involving exposure through a photomask uses a light source of shorter wavelength in order to produce a finer image. In the advanced lithography process for current use on a commercial basis, the light source for exposure has shifted from KrF excimer laser light (248 nm) to ArF excimer laser light (193 nm).

The lithography using ArF excimer laser light of greater energy was found to cause damages to the mask, which were not found with KrF excimer laser light. One problem is that on continuous use of the photomask, foreign matter-like growth defects form on the photomask. These growth defects are also known as "haze". The source of haze formation was formerly believed to reside in the growth of ammonium sulfate crystals on the mask pattern surface. It is currently believed that organic matter participates in haze formation as well.

Some approaches are known to overcome the haze problem. For example, with respect to the growth defects formed on the photomask upon long-term irradiation of ArF excimer laser light, JP-A 2008-276002 describes that the photomask must be cleaned at a predetermined stage before the photomask can be continuously used. Also JP-A 2010-156880 discloses that haze formation can be inhibited by oxidative treatment of a surface of a photomask blank.

Nevertheless, as the dose of ArF excimer laser light irradiated for pattern transfer increases, the photomask is given damages other than haze. It was found that the line width of the mask pattern changes in accordance with the cumulative irradiation energy dose. See Thomas Faure et al., "Characterization of binary mask and attenuated phase shift mask blanks for 32 nm mask fabrication," Proc. of SPIE vol. 7122, pp 712209-1 to 712209-12. This problem is that as the cumulative irradiation energy dose increases during long-term irradiation of ArF excimer laser light, a layer of a substance which is considered to be an oxide of the pattern material grows outside the film pattern, whereby the pattern width changes. It is reported that the mask once damaged cannot be restored by cleaning with SC-1 (aqueous ammonia/aqueous hydrogen peroxide) as used in the above-mentioned haze removal or with sulfuric acid/aqueous hydrogen peroxide. It is believed that the damage source is utterly different.

The above article points out that upon exposure of a circuit pattern through a halftone phase shift mask which is the mask technology useful in expanding the depth of focus, substantial degradation is induced by pattern size variation resulting from alternation of a transition metal/silicon base material film such as MoSi base material film by irradiation of ArF excimer laser light (this degradation is referred to as "pattern size variation degradation"). Then, in order to use an expensive photomask over a long period of time, it is necessary to address the pattern size variation degradation by irradiation of ArF excimer laser light.

CITATION LIST

| | |
|---|---|
| Patent Document 1: | JP-A 2008-276002 (U.S. Pat. No. 7,941,767) |
| Patent Document 2: | JP-A 2010-156880 (US 20100167185, DE 102009060677, KR 20100080413) |
| Patent Document 3: | JP-A H07-140635 |
| Patent Document 4: | JP-A H10-171096 |
| Patent Document 5: | JP-A 2004-133029 |
| Patent Document 6: | JP-A H07-181664 |
| Patent Document 7: | JP-A H04-125642 |
| Patent Document 8: | JP-A 2007-033469 |
| Patent Document 9: | JP-A 2007-233179 |
| Patent Document 10: | JP-A 2007-241065 |
| Non-Patent Document 1: | Thomas Faure et al., "Characterization of binary mask and attenuated phase shift mask blanks for 32 nm mask fabrication," Proc. of SPIE vol. 7122, pp 712209-1 to 712209-12 |

SUMMARY OF INVENTION

Technical Problem

As pointed out in Non-Patent Document 1, the pattern size variation degradation by irradiation of ArF excimer laser light does scarcely occur when light is irradiated in a dry air atmosphere. Exposure in a dry air atmosphere is regarded as a new approach for inhibiting the pattern size variation degradation. However, the control of a dry air atmosphere adds an extra unit to the exposure system and gives rise to electrostatic and other problems to be managed, leading to an increased expense. Under the circumstances, the inventors attempted to improve the film material of a photomask so as to enable long-term exposure in a common atmosphere that does not need complete removal of humidity (typically having a humidity of around 50%).

The photomasks used in the lithography using ArF excimer laser light as light source include halftone phase shift masks which use a transition metal-containing silicon base material, typically a molybdenum-containing silicon base material. This silicon base material is mainly composed of a transition metal and silicon, and further contains oxygen and/or nitrogen as light element (e.g., Patent Document 3), or further contains a minute amount of carbon and/or hydrogen (e.g., Patent Document 4). Suitable transition metals used include Mo, Zr, Ta, W, and Ti. Among others, Mo is most commonly used (e.g., Patent Document 3), and sometimes a second transition metal is added (e.g., Patent Document 5). For the light-shielding film as well, a transition metal-containing silicon base material, typically a molybdenum-containing silicon base material is used.

While the prior art halftone phase shift film uses the aforementioned material to achieve a phase shift of exposure light and a necessary amount of attenuation, it is preferably designed so as to provide the film with a high refractive index by incorporating a certain amount of nitrogen and to acquire optimum optical and chemical properties by adding a necessary amount of oxygen (e.g., Patent Document 6). In particular, the film material adapted for ArF excimer laser light is given the required physical properties by incorporating a larger amount of nitrogen than that for KrF excimer laser light, and optionally, adding a relatively small amount of oxygen. Nevertheless, when a photomask using such a material is irradiated with a large dose of high-energy radiation, the mask undergoes significant pattern size variation degradation by irradiation of high-energy radiation. Then the service lifetime of the photomask is shorter than the requirement.

When a photomask blank is processed into a photomask, sometimes the light-shielding film material is not removed as designed, with such undesired residues becoming defects known as "black defects." Since the photomask is prepared by the time-consuming lithography process, it is desirable that if black defects are formed, the photomask be repaired so that it may be used again.

As the effective technique of removing black defects by local etching of a silicon base material film, Patent Document 7 discloses electron beam defect correction using fluorine. However, many optical films (e.g., halftone phase shift films and light-shielding films) made of transition metal/silicon base materials having a low transition metal content are difficult to correct black defects by such a technique. In the attempt to correct defects on mask pattern by directing a beam of high-energy radiation in a fluorine-containing gas atmosphere to generate fluorine radicals for thereby etching away black defects, often a sufficient etching selectivity ratio is not available between the film and the silicon oxide substrate. Thus the attempt to strip off black defects causes the substrate to be etched at the same time, resulting in a mask having a phase difference deviated from the designed value.

An object of the invention is to provide a halftone phase shift mask, a halftone phase shift mask blank therefor, and a light pattern exposure method using the mask, the halftone phase shift mask having a pattern of halftone phase shift film which when used in pattern exposure using ArF excimer laser light or analogous light having high energy and short wavelength as compared with the conventional light, and even after a large cumulative dose of irradiation energy, inhibits pattern size variation degradation resulting from film quality alternation of the photomask by irradiating light, and establishes a sufficient selectivity ratio relative to the substrate during the etching step of the electron beam defect correction method using fluorine for correction of black defects.

Solution to Problem

Regarding the transition metal-containing silicon base material (simply referred to as transition metal/silicon base material) used as halftone phase shift film or the like, the inventors made efforts to develop a film material which experiences minimal pattern size variation degradation resulting from quality alternation of the film material even when it is irradiated with ArF excimer laser light in a controlled humid atmosphere as commonly used in the lithography using a photomask, and which allows for the above-described etching step for correction of black defects.

The inventors made experiments as follows. Photomasks having a film of transition metal/silicon base material were prepared. Many film samples of transition metal/silicon base material containing nitrogen and oxygen were formed while varying the contents of transition metal, silicon, nitrogen and oxygen. The film samples were irradiated with ArF excimer laser light in cumulative doses. The photomasks were compared with respect to pattern size variation degradation. It was found that differences in nitrogen and oxygen contents have large impacts on the pattern size variation degradation. When the nitrogen and oxygen contents are set within the predetermined range as long as the required function of the halftone phase shift mask is met, the pattern size variation degradation is inhibited by setting the ratio of transition metal to silicon to be equal to or less than the predetermined ratio. The film material having such a composition can establish an etching selectivity ratio relative to the substrate. Then the method of correcting defects on mask pattern by directing a beam of high-energy radiation in a fluorine-containing gas atmosphere to generate fluorine radicals for thereby etching away black defects is applicable. The invention is predicated on these findings.

In one aspect, the invention provides a light pattern exposure method comprising irradiating a pattern of light to a resist film through a photomask using ArF excimer laser light as the light source. The photomask used is such a halftone phase shift mask that it has been irradiated with ArF excimer laser light in a cumulative dose of at least 10 kJ/cm$^2$. The halftone phase shift mask comprises a transparent substrate and a pattern of halftone phase shift film of a material comprising a transition metal, silicon, nitrogen and oxygen, the material having an atomic ratio of transition metal to silicon (Met/Si) from 0.18 to 0.25, a nitrogen content of 25 atom % to 50 atom %, and an oxygen content of 5 atom % to 20 atom %, except for an outermost surface region extending from the film surface remote from the substrate to a depth of 10 nm.

In a preferred embodiment, the halftone phase shift mask has been treated for defect correction by directing a high-energy radiation beam in a fluorine base gas atmosphere.

In another aspect, the invention provides a halftone phase shift mask for use in a light pattern exposure method comprising irradiating a pattern of light to a resist film through the mask using ArF excimer laser light as the light source, said halftone phase shift mask being such that it may be irradiated with ArF excimer laser light in a cumulative dose of at least 10 kJ/cm$^2$. The halftone phase shift mask comprises a transparent substrate and a pattern of halftone phase shift film. The pattern is obtained by forming a halftone phase shift film of a material comprising a transition metal, silicon, nitrogen and oxygen on the substrate and patterning the film, the material having an atomic ratio of transition metal to silicon (Met/Si) from 0.18 to 0.25, a nitrogen content of 25 atom % to 50 atom %, and an oxygen content of 5 atom % to 20 atom %, except for an outermost surface region extending from the film surface remote from the substrate to a depth of 10 nm.

In a preferred embodiment, the transparent substrate is a silicon oxide substrate, and an etching selectivity ratio of at least 4 is established between the halftone phase shift film and the silicon oxide substrate.

In a further aspect, the invention provides a halftone phase shift mask blank from which a halftone phase shift mask is prepared, wherein the halftone phase shift mask is used in irradiating a pattern of light to a resist film using ArF excimer laser light as the light source, and the halftone phase shift mask may be irradiated with ArF excimer laser light in a cumulative dose of at least 10 kJ/cm$^2$. The halftone phase shift mask blank comprises a transparent substrate and a halftone phase shift film of a material comprising a transition metal, silicon, nitrogen and oxygen, the material having an atomic ratio of transition metal to silicon (Met/Si) from 0.18 to 0.25, a nitrogen content of 25 atom % to 50 atom %, and an oxygen content of 5 atom % to 20 atom %, except for an outermost surface region extending from the film surface remote from the substrate to a depth of 10 nm.

In a preferred embodiment, the transparent substrate is a silicon oxide substrate, and an etching selectivity ratio of at least 4 is established between the halftone phase shift film and the silicon oxide substrate.

In the foregoing embodiments, the transition metal is typically molybdenum.

Advantageous Effects of Invention

The halftone phase shift film of transition metal/silicon base material has the advantage that the pattern size variation degradation resulting from quality alternation of the transition metal/silicon base material film (typically MoSi base material film) by cumulative irradiation of ArF excimer laser light is restrained within the permissible range. Even when the cumulative dose of ArF excimer laser light irradiation increases, the light pattern irradiation of photolithography can be performed over a long time without a substantial pattern size variation degradation of light pattern and without changing the pattern exposure conditions of the exposure tool. The halftone phase shift film not only inhibits pattern size variation degradation by cumulative irradiation, but also establishes a sufficient etching selectivity ratio. Even when black defects are formed on the mask pattern, defect correction can be made by directing a beam of high-energy radiation, typically electron beam in a fluorine-containing gas atmosphere to generate fluorine radicals for thereby etching away black defects.

DESCRIPTION OF EMBODIMENTS

Figure 1:
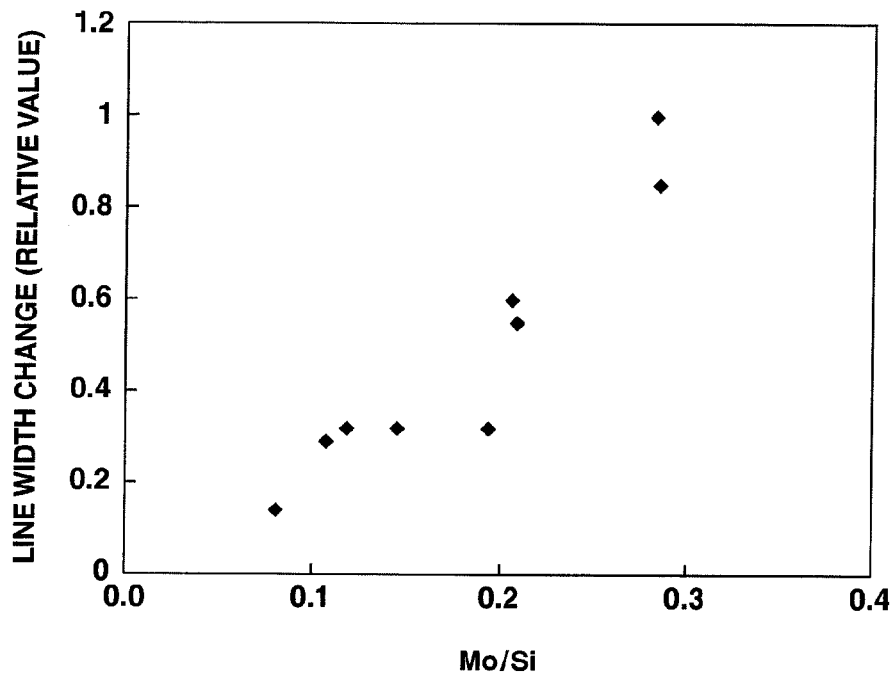
FIG. 1 is a diagram showing line width variation versus Mo/Si ratio in Experiments.

A halftone phase shift mask for use in the light pattern exposure method of the invention is prepared from a halftone phase shift mask blank comprising a transparent substrate such as quartz substrate and a transition metal/silicon base material film disposed on the substrate, the film being formed of a material comprising a transition metal, silicon, nitrogen and oxygen.

This transition metal/silicon base material film is a halftone phase shift film which provides a predetermined phase shift (most often, about 180°) and a predetermined transmittance (most often, 1 to 40%) relative to ArF excimer laser light as the exposure light.

First, a size variation occurring as the cumulative dose of irradiation energy of ArF excimer laser light increases is examined. Namely, it is examined how a size variation which is induced by continuously irradiating a material comprising a transition metal (typically molybdenum), silicon, nitrogen and oxygen with ArF excimer laser light in the presence of water depends on the material composition. To this end, a variety of materials containing a transition metal, silicon, nitrogen and oxygen were prepared. A size variation induced upon irradiation of ArF excimer laser light was measured. A relation of material composition and size variation was evaluated.

With a focus on the material used as the halftone phase shift film, the nitrogen and oxygen contents should fall in certain limited ranges in order to meet optical properties including transmittance and refractive index. Provided that the nitrogen content is in a range of 25 to 50 atom % and the oxygen content is in a range of 5 to 20 atom %, an attention is paid to the transition metal content and the silicon content. For the materials used as the halftone phase shift film, a relation of an atomic ratio of transition metal to silicon (Met/Si) and a size variation was evaluated. There was a correlation between the atomic ratio (Met/Si) and the size variation. There was a tendency that a material with a lower atomic ratio (Met/Si) undergoes a less size variation. As to size variation, it was found that by reducing the atomic ratio (Met/Si) during preparation of a halftone phase shift film, the size variation occurring upon irradiation of ArF excimer laser light can be reduced.

Nevertheless, many transition metal/silicon base materials having a low atomic ratio of transition metal to silicon (Met/Si) establish an insufficient etching selectivity ratio relative to silicon oxide or substrate, which is crucial when the method of directing a beam of high-energy radiation in a fluorine-containing gas atmosphere to generate fluorine radicals for thereby locally etching at the point of beam irradiation is applied as the most preferred black defect correction method. That is, these materials raise a new problem that the correction method is not applicable.

It is desirable to increase the etching selectivity ratio between the halftone phase shift film and the silicon oxide substrate when the aforementioned fluorine base etching method is applied. However, as long as the materials meeting optical properties necessary as the halftone phase shift film for ArF excimer laser light are concerned, it is difficult to increase the etching selectivity ratio by changing the contents of light elements. Then an attempt was made to increase the etching selectivity ratio by changing the ratio of transition metal to silicon.

A focus was then put on the transition metal content and the silicon content. For the materials used as the halftone phase shift film, a relation of etching selectivity ratio to the atomic ratio of transition metal to silicon (Met/Si) was further evaluated. There was a correlation between the atomic ratio (Met/Si) and the etching selectivity ratio. That is, there was a tendency that a material having a high atomic ratio (Met/Si) provides a high etching selectivity ratio. As to etching selectivity ratio, it was found that by increasing the atomic ratio (Met/Si) during preparation of a halftone phase shift film, a high etching selectivity ratio can be set.

In the practice of the invention predicated on these findings, transition metal/silicon base materials having a nitrogen content of 25 to 50 atom %, an oxygen content of 5 to 20 atom %, and an atomic ratio of transition metal to silicon (Met/Si) of at least 0.18, preferably at least 0.19, and up to 0.25, preferably up to 0.21 are applied.

Described below are the halftone phase shift mask used in the light pattern exposure method of the invention and a halftone phase shift mask blank for the mask.

The halftone phase shift mask blank is defined as comprising a transparent substrate and a halftone phase shift film of a material comprising a transition metal, silicon, nitrogen and oxygen, sometimes referred to as "transition metal/silicon base material." The composition of the halftone phase shift film has an atomic ratio of transition metal to silicon (Met/Si)

from 0.18 to 0.25, a nitrogen content of 25 to 50 atom %, and an oxygen content of 5 to 20 atom %, except for an outermost surface region extending from the film surface disposed remote from the substrate to a depth of 10 nm. The blank is processed into a halftone phase shift mask comprising the transparent substrate and a mask pattern obtained by patterning the halftone phase shift film.

Although a film of this transition metal/silicon base material undergoes a pattern size variation upon irradiation of ArF excimer laser light, the line width variation is limited to 5 nm or less, preferably 4 nm or less even after ArF excimer laser light has been irradiated in a cumulative dose of 10 kJ/cm$^2$. Also the film establishes an etching selectivity ratio of at least 4, preferably at least 4.5 relative to the quartz substrate, allowing the fluorine-assisted EB defect correction method to be applied.

The outermost surface region extending from the film surface remote from the substrate to a depth of 10 nm is excluded in defining the composition of the film, because the outermost surface region of the transition metal/silicon base material film has a high degree of oxidation due to atmospheric oxidation or because the film has sometimes been subjected to forced oxidative treatment in order to endow chemical resistance during cleaning or resistance to atmospheric oxidation. There is a possibility that only the outermost surface region of the film is outside the compositional range although the remaining region of the film is within the compositional range. The surface region having a thickness of the described order has no significant impact on the pattern size variation degradation and the etching selectivity ratio necessary for defect correction.

The halftone phase shift film of the transition metal/silicon base material falling within the specific compositional range except for the outermost surface region undergoes only limited pattern size variation degradation even when it is irradiated with ArF excimer laser light over a long term, or differently stated, even when the cumulative dose of irradiation is increased.

In the process to be employed in the future for light pattern exposure through a photomask, the photomask is required, from the standpoint of economy in the immersion lithography or the like, to satisfy that the size variation of the mask pattern is below the permissible level until the cumulative irradiation energy dose reaches about 10 kJ/cm$^2$. For the 22 nm pattern rule, the permissible level is of the order of ±5 nm, preferably ±4 nm. On the other hand, when black defects which can be generated upon processing into a photomask are corrected by the fluorine radical etching method, an etching selectivity ratio of at least 4, preferably at least 4.5 must be established between the halftone phase shift film and the silicon oxide substrate in order to carry out the correction without causing damages to the transparent substrate (typically silicon oxide or quartz substrate). If the transition metal/silicon base material falls within the specific compositional range except for the outermost surface region, a film thereof can accommodate these requirements.

In the embodiment wherein the halftone phase shift film is designed for a phase shift of about 180°, the halftone phase shift film as a whole may have an appropriate thickness in the range of 50 to 150 nm, more preferably 60 to 90 nm. When a high light absorptive layer and a low light absorptive layer are combined to construct a structure consisting of uniform composition layers, it is preferred that the high light absorptive layer have a thickness of 1 to 30 nm, especially 5 to 20 nm and the low light absorptive layer have a thickness of 30 to 120 nm, especially 40 to 70 nm. In the case of such multilayer structure, it is preferred for improved chemical resistance that the high light absorptive layer be disposed closer to the transparent substrate. To improve the detection sensitivity to inspection wavelength, this embodiment may also take the form of a three-layer structure in which a low light absorptive layer is sandwiched between two high light absorptive layers, or a four or multilayer structure in which high light absorptive layers and low light absorptive layers are alternately stacked in order on the transparent substrate (either of the layers may be first).

Preferred examples of the material containing transition metal, silicon, nitrogen and oxygen of which the transition metal/silicon base material film is formed include transition metal/silicon oxynitride and transition metal/silicon oxide nitride carbide.

The transition metal is preferably at least one element selected from among titanium, vanadium, cobalt, nickel, zirconium, niobium, molybdenum, hafnium, tantalum, and tungsten. Of these, molybdenum is most preferred from the standpoint of dry etching. The content of transition metal is discussed first. If the transition metal content is high, the contents of other elements are relatively low, making it difficult to adjust the compositional ratio of respective elements so as to meet the required optical properties including refractive index and transmittance. Then in the transition metal/silicon base material film except for the outermost surface region, the transition metal content is preferably at least 5 atom %, more preferably at least 6 atom %, and up to 12 atom %, more preferably up to 10 atom %. Also in the transition metal/silicon base material film except for the outermost surface region, the silicon content is preferably at least 30 atom %, more preferably at least 35 atom %, and up to 50 atom %, more preferably up to 45 atom %.

In the transition metal/silicon base material film except for the outermost surface region, the oxygen content should be up to 20 atom %. Too high an oxygen content leads to too low an etching selectivity ratio relative to the substrate to apply the high-energy beam defect correction method using fluorine base gas. Also the oxygen content should be at least 5 atom %. At too low an oxygen content, the content of nitrogen or transition metal must be increased to acquire necessary optical properties, and as a result, the pattern size variation degradation after long-term irradiation of ArF excimer laser light is increased.

In the transition metal/silicon base material film except for the outermost surface region, the nitrogen content should be at least 25 atom %, preferably at least 30 atom %. The range ensures a necessary refractive index and transmittance when the oxygen content is within the specific range. Also the nitrogen content should be up to 50 atom %. At too high a nitrogen content, the pattern size variation degradation after long-term irradiation of ArF excimer laser light is increased.

The transition metal/silicon base material film may further contain carbon, hydrogen and rare-gas elements in low contents. The content of such an element is preferably up to 5 atom % and more preferably carbon should not exceed the impurity level.

The transition metal/silicon base material film may be deposited by well-known techniques. Among others, the sputtering technique is preferred because a film featuring homogeneity is readily deposited. The sputtering technique may be either DC sputtering or RF sputtering.

A choice of target and sputtering gas depends on the layer construction and composition. The target may be a single target in which a ratio of transition metal to silicon is adjusted appropriate or a combination of targets selected from a transition metal target, a silicon target, and a transition metal/silicon target. Where plural targets are used, the ratio of transition metal to silicon may be controlled by adjusting the sputtering area of an individual target or by adjusting the power applied to an individual target. Particularly when a multilayer structure is constructed by combining a high light absorptive layer with a low light absorptive layer, the content of transition metal in the high light absorptive layer and the low light absorptive layer may be independently changed by the above-described method. If the low light absorptive layer has a low transition metal content, then the contents of the remaining elements may be readily set so as to meet the desired optical properties.

The nitrogen and oxygen contents may be adjusted by effecting reactive sputtering using nitrogen-containing gas and oxygen-containing gas as the reactive sputtering gas while adjusting the flow rates of these gases. This is true when other light elements such as carbon and hydrogen are added. Examples of the reactive gas used herein include nitrogen gas, oxygen gas, nitrogen oxide gas, carbon oxide gas, hydrocarbon gas, hydrogen gas, and the like. In addition, a rare gas such as helium, neon or argon gas may be used.

As mentioned above, the halftone phase shift film at its outermost surface may be provided with a surface oxidized layer for the purpose of stabilizing the film. The means for forming the surface oxidized layer include air oxidation or atmospheric oxidation and forced oxidative treatment. The forced oxidative treatment of a transition metal/silicon base material film may be performed, for example, by treating with ozone gas or ozone water, or by heating at a temperature of about 300° C. such as oven heating in an oxygen-containing atmosphere, lamp annealing, and laser heating. The surface oxidized layer has a thickness of up to 10 nm, and a thickness of at least 1 nm is sufficient to be effective as an oxide layer. The surface oxidized layer having a thickness of this order has no substantial impact on the pattern size variation degradation by irradiation of ArF excimer laser light. Although the surface oxidized layer may be formed by increasing the flow rate of oxygen during the sputtering process, it is preferably formed by the above-mentioned air oxidation or forced oxidative treatment after the halftone phase shift film has been deposited to the desired composition because the layer formed thereby contains less defects.

In the halftone phase shift mask blank from which a halftone phase shift mask for use in the exposure method of the invention is prepared, like conventional halftone phase shift mask blanks, a light-shielding film may be formed on the halftone phase shift film in order to provide a full light shielding region thereon. Although the light-shielding film may be made of any desired materials, a film of chromium base material which can be also utilized as an auxiliary film for etching process is preferred. With respect to the construction and composition of the light-shielding film, a number of reports are known, for example, from Patent Documents 8 and 9. Preferably the light-shielding film is constructed by forming a Cr base light-shielding film, and further depositing thereon a Cr base antireflective film for reducing reflection from the light-shielding film. The light-shielding film and antireflective film each may be a single layer or a multilayer structure. The materials for the Cr base light-shielding film and antireflective film include chromium alone, chromium oxide (CrO), chromium nitride (CrN), chromium carbide (CrC), chromium oxynitride (CrON), chromium oxycarbide (CrOC), chromium nitride carbide (CrNC), and chromium oxide nitride carbide (CrONC).

The Cr base light-shielding film and antireflective film may be deposited by reactive sputtering. The reactive sputtering process uses a target of chromium alone or a target of chromium having one or more of oxygen, nitrogen and carbon added thereto. The sputtering gas is an inert gas such as Ar, He, Ne or Kr, to which a gas selected from oxygen-containing gas, nitrogen-containing gas and carbon-containing gas in accordance with the desired composition of a film being deposited is added.

In another version of the embodiment wherein a light-shielding film is provided, an auxiliary film or etch stop film of chromium base material as disclosed in Patent Document 10 may be formed on the halftone phase shift film, and a light-shielding film of a transition metal/silicon base compound be formed thereon.

The halftone phase shift mask blank may be processed into a halftone phase shift mask by a standard technique. For example, a halftone phase shift mask blank comprising a halftone phase shift film and a light-shielding film or antireflective film of chromium base material deposited thereon may be processed as follows.

First, a resist film adapted for electron beam (EB) lithography is formed on the halftone phase shift mask blank, exposed to a pattern of EB, and developed in a conventional way, forming a resist pattern. While the resist pattern thus obtained is used as etching mask, oxygen-containing chlorine base dry etching is carried out for transferring the resist pattern to the chromium base material film. While the chromium base material film pattern is used as etching mask, fluorine base dry etching is carried out for transferring the pattern to the halftone phase shift film. If any region of the chromium base material film is to be left as a light-shielding film, a resist pattern for protecting that region is formed. Thereafter, the unnecessary chromium base material film is stripped off by oxygen-containing chlorine base dry etching again. The resist material is removed in a conventional manner, yielding a halftone phase shift mask.

Where black defects are formed on the halftone phase shift mask, the defect correction method of directing a beam of high-energy radiation in the presence of fluorine-containing gas to generate fluorine radicals for etching is applicable as long as the mask is prepared from the halftone phase shift mask blank according to the invention. As the etching method, the EB defect correction method using fluorine is advantageous.

The fluorine-assisted EB defect correction method used herein is disclosed in JP-A H04-125642 (Patent Document 7) wherein a film which can be etched with fluorine base gas is subjected to local fluorine base dry etching for correcting defects. In this method, a fluorine-containing gas such as $XeF_2$ gas is supplied to a photomask to be repaired, whereby the fluorine-containing gas molecule is adsorbed to the surface of the film to be corrected. An electron beam (EB) is then directed to a point of correction to be etched whereupon fluorine is liberated from the fluorine-containing gas molecule adsorbed. The thus liberated fluorine reacts at the point of correction to form transition metal fluoride and silicon fluoride whereupon these products volatilize off, that is, defects are etched away.

The fluorine-containing gas may be any of well-known gases for fluorine-base dry etching, including carbon fluorides and fluorinated hydrocarbons such as $CF_4$, CHF, and $C_2F_6$, $XeF_2$ and the like. These gases may be used alone or in admixture and further in combination with oxygen gas. Adsorption of etchant gas may be carried out, for example, by placing a photomask to be repaired in a vacuum chamber and injecting a suitable flow rate of a gas to the film to be corrected over a predetermined time. The photomask is preferably cooled so that more fluorine-containing gas may be adsorbed. Etching conditions generally include a chamber pressure of up to 0.13 Pa, an assist gas line pressure of 50 to 3,000 Pa, and a beam accelerating voltage of 0.5 to 20 keV. As the system for carrying the correction method into practice, an E-beam based mask repair system MeRiT® from Carl Zeiss is most advantageously used.

The light pattern exposure method of the invention is defined as comprising preparing a halftone phase shift mask from the halftone phase shift mask blank and projecting ArF excimer laser light to the pattern of transition metal/silicon material film on the mask to irradiate ArF excimer laser light to an object (resist film) through the mask for thereby exposing the object to the mask pattern of light. The irradiation of ArF excimer laser light may be either dry lithography or immersion lithography. The invention is useful particularly when a wafer of at least 300 mm as a work to be processed is exposed to a pattern of light by the immersion lithography with the tendency that a cumulative irradiation energy dose increases within a relatively short time in commercial scale microfabrication.

It is a serious problem that when a mask pattern of a transition metal/silicon base material film is irradiated with ArF excimer laser light, the mask pattern experiences a variation of line width. The permissible threshold of pattern width differs with the mask pattern, especially the pattern rule applied thereto. If variations are small, the mask may be further used by correcting the conditions and resetting the irradiation conditions of an exposure system. When the halftone phase shift mask of the invention is used, the pattern size variation degradation by irradiation of light is substantially nil as long as the cumulative irradiation energy dose is less than 10 kJ/cm$^2$. Even when the cumulative irradiation energy dose exceeds 10 kJ/cm$^2$, the pattern size variation degradation by irradiation of light is minimal, allowing the light pattern exposure to be continued without resetting the transfer conditions.

EXAMPLES

Experiments are given below for further illustrating the invention although the invention is not limited thereto.
Experiments 1 to 9

A DC sputtering system was loaded with two targets, a MoSi$_2$ target and a Si target, and Ar gas, O$_2$ gas and N$_2$ gas were fed thereto as sputtering gas. While a quartz substrate was spun at 30 rpm, a single layer consisting of molybdenum, silicon, nitrogen, and optional oxygen was deposited on the substrate to form a transition metal/silicon base material film (molybdenum/silicon base material film) of about 70 nm thick as a halftone phase shift film. The composition of these 9 transition metal/silicon base material films except for a sub-surface region that extended from the film surface to a depth of 10 nm was analyzed by ESCA.

Next, on the transition metal/silicon base material film, a light-shielding film of chromium base material was deposited using a Cr target and sputtering gases. Specifically, a CrON layer of 20 nm thick was deposited by feeding Ar, N$_2$ and O$_2$ gases in a flow rate ratio of Ar:N$_2$:O$_2$=1:2:1, a Cr layer of 7 nm thick was deposited by feeding only Ar gas, and a CrON layer of 20 nm thick was deposited by feeding Ar, N$_2$ and O$_2$ gases in a flow rate ratio of Ar:N$_2$:O$_2$=1:2:1. In this way, a light-shielding film of chromium base material having a total thickness of 47 nm was formed, yielding a photomask blank (halftone phase shift mask blank).

Next, a positive resist film for EB lithography was formed on the light-shielding film. The resist film was exposed to a pattern of EB, forming an iso-line, iso-space, line-and-space model pattern having a line width of 0.1 to 2 μm.

With the resist pattern made etching mask, the light-shielding film was dry etched with chlorine base etchant. Then the transition metal/silicon base material film was dry etched with fluorine base etchant. Finally the light-shielding film was removed by chlorine base dry etching, yielding a photomask (halftone phase shift mask) having a pattern of the transition metal/silicon base material film.

In an environment of 23° C. and humidity 40%, the photomask thus obtained was irradiated with ArF excimer laser light having a pulse width of 200 Hz and a pulse energy of 50 to 200 mJ until the cumulative irradiation energy dose reached 30 kJ/cm$^2$. An exposure system ArFES-3500PM (Litho Tech Japan Corp.) and a light source LPX Pro220 (Coherent GmbH) were used.

The size of the pattern of transition metal/silicon base material film was measured under a scanning electron microscope LWM9045 (Vistec) to determine how the pattern size varied when the pattern was irradiated with ArF excimer laser light. It was observed that the line width increased in a rate proportional to time independent of the type and size of the pattern.

For patterns of different type and line width, changes (increases) of line width were averaged. The average was expressed in a relative value provided that the average change (19 nm) of Experiment 3 is 1. Also a change corresponding to a cumulative irradiation dose of 10 kJ/cm$^2$ was computed from the measured change. The data are shown in Table 1 together with the contents of respective elements on analysis of the film as deposited and plotted in FIG. 1 as a function of Mo/Si ratio. Those data are also shown in FIG. 2 excluding the data of the sample (Experiment 8) falling outside the nitrogen content range of 25 to 50 atom % and the oxygen content range of 5 to 20 atom %.

TABLE 1

|  |  | Content (at %) | | | | Mo/Si (atomic ratio) | Line width change (relative value) | Line width change (nm) corresponding to cumulative dose of 10 kJ/cm$^2$ |
|---|---|---|---|---|---|---|---|---|
|  |  | Mo | Si | N | O |  |  |  |
| Experiment | 1 | 7.8 | 37.9 | 44.2 | 10.1 | 0.206 | 0.60 | 3.8 |
|  | 2 | 7.8 | 37.4 | 41.7 | 13.1 | 0.209 | 0.55 | 3.5 |
|  | 3 | 10.6 | 37.4 | 39.8 | 12.2 | 0.283 | 1.00 | 6.3 |
|  | 4 | 6.6 | 45.5 | 39.3 | 8.6 | 0.145 | 0.32 | 2.0 |
|  | 5 | 5.1 | 43.2 | 38.5 | 13.2 | 0.118 | 0.32 | 2.0 |
|  | 6 | 4.3 | 40.2 | 42.2 | 13.3 | 0.107 | 0.29 | 1.8 |
|  | 7 | 3.8 | 47.3 | 40.8 | 8.1 | 0.080 | 0.14 | 0.9 |
|  | 8 | 9.0 | 46.5 | 39.8 | 4.7 | 0.194 | 0.32 | 2.0 |
|  | 9 | 9.7 | 34.0 | 42.2 | 14.1 | 0.285 | 0.85 | 5.4 |

Figure 2:
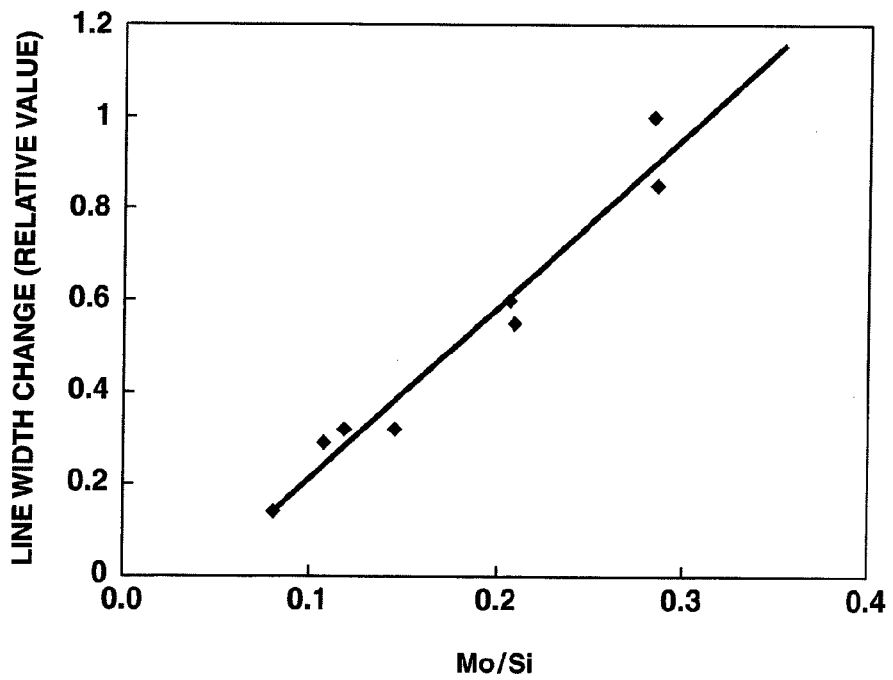
FIG. 2 is a diagram showing line width variation versus Mo/Si ratio in Experiments, with a regression line.

On regression analysis by the least square method using eight (8) points depicted in FIG. 2, the following correlation formula was obtained with a correlation coefficient $R^2$ being 0.96. The regression line is also depicted in FIG. 2.

Line width change(relative value)=3.70×(Met/Si)−0.15

It is evident from this correlation formula that the Met/Si ratio giving a line width change within the permissible range of 5 nm when ArF excimer laser light is irradiated in a cumulative dose of 10 kJ/cm$^2$ is up to 0.25, the Met/Si ratio giving a line width change within the preferred range of 4 nm is up to 0.21. Thus as long as the nitrogen content is from 25 to 50 atom %, the oxygen content is from 5 to 20 atom %, and the atomic ratio of transition metal to silicon (Met/Si) is up to 0.25, the transition metal/silicon base material is fully restrained in pattern size variation due to irradiation of ArF excimer laser light, and the line width change is restricted to 5 nm or less even after irradiation in a cumulative dose of 10 kJ/cm$^2$.

Experiments 10 to 21

A DC sputtering system was loaded with two targets, a MoSi$_2$ target and a Si target, and Ar gas, O$_2$ gas and N$_2$ gas were fed thereto as sputtering gas. While a quartz substrate was spun at 30 rpm, a single layer consisting of molybdenum, silicon, nitrogen, and optional oxygen was deposited on the substrate to form a transition metal/silicon base material film (molybdenum/silicon base material film) of about 70 nm thick as a halftone phase shift film. The composition of these 12 transition metal/silicon base material films except for a sub-surface region that extended from the surface to a depth of 10 nm was analyzed by ESCA.

Using an EB-based mask repair system MeRiT® (Carl Zeiss), the transition metal/silicon base material film thus deposited was etched by placing it in a chamber pumped to a vacuum of 0.13 Pa or below, and injecting xenon fluoride gas as the etching-assist gas to near the point of correction. The etching rate of fluorine-assisted EB defect correction method was determined. By comparing it with the etching rate of quartz substrate, an etching selectivity ratio was determined.

Figure 3:
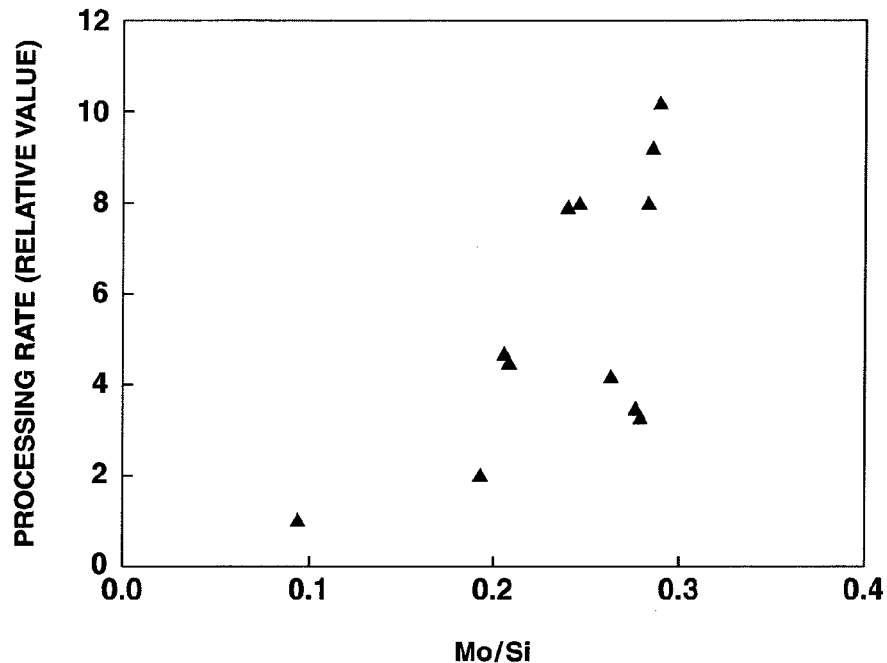
FIG. 3 is a diagram showing processing rate versus Mo/Si ratio in Experiments.

The etching selectivity ratio is shown in Table 2 together with the contents of respective elements on analysis of the film as deposited. The processing rates (relative values) corresponding to etching selectivity ratios are plotted in FIG. 3 as a function of Mo/Si ratio. Those data are also shown in FIG. 4 excluding the data of the samples (Experiments 13 and 16 to 18) falling outside the nitrogen content range of 25 to 50 atom % and the oxygen content range of 5 to 20 atom %.

TABLE 2

|  |  | Content (at %) | | | | Mo/Si (atomic ratio) | Etching selectivity ratio (to SiO$_2$) |
|---|---|---|---|---|---|---|---|
|  |  | Mo | Si | N | O | | |
| Experiment | 10 | 7.8 | 37.9 | 44.2 | 10.1 | 0.206 | 4.7 |
|  | 11 | 7.8 | 37.4 | 41.7 | 13.1 | 0.209 | 4.5 |
|  | 12 | 10.6 | 37.4 | 39.8 | 12.2 | 0.283 | 8.0 |
|  | 13 | 9.0 | 46.5 | 39.8 | 4.7 | 0.194 | 2.0 |
|  | 14 | 9.7 | 34.0 | 42.2 | 14.1 | 0.285 | 9.2 |
|  | 15 | 4.1 | 43.4 | 43.9 | 8.6 | 0.094 | 1.0 |
|  | 16 | 9.6 | 34.7 | 29.4 | 26.3 | 0.277 | 3.5 |
|  | 17 | 9.1 | 32.6 | 27.7 | 30.6 | 0.279 | 3.3 |
|  | 18 | 8.8 | 33.4 | 32.7 | 25.1 | 0.263 | 4.2 |
|  | 19 | 9.6 | 33.2 | 38.1 | 19.1 | 0.289 | 10.2 |
|  | 20 | 8.7 | 36.3 | 47.3 | 7.7 | 0.240 | 7.9 |
|  | 21 | 8.7 | 35.3 | 41.7 | 14.3 | 0.246 | 8.0 |

Figure 4:
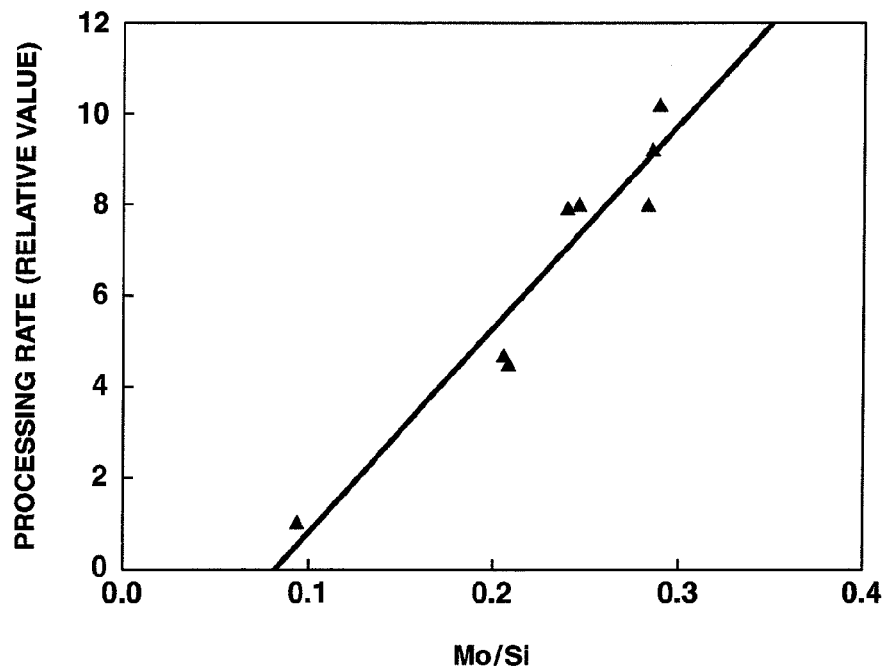
FIG. 4 is a diagram showing processing rate versus Mo/Si ratio in Experiments, with a regression line.

On regression analysis by the least square method using eight (8) points depicted in FIG. 4, the following correlation formula was obtained with a correlation coefficient $R^2$ being 0.92. The regression line is also depicted in FIG. 4.

Etching selectivity ratio=45.12×(Met/Si)−3.76

It is evident from this correlation formula that the Met/Si ratio giving an etching selectivity ratio of at least 4 relative to quartz substrate that allows for application of the method of correcting defects on mask pattern by directing a beam of high-energy radiation in a fluorine-containing gas atmosphere to generate fluorine radicals for etching away black defects is at least 0.18, the Met/Si ratio giving a preferred etching selectivity ratio of at least 4.5 is at least 0.19. Then as long as the nitrogen content is from 25 to 50 atom, the oxygen content is from 5 to 20 atom, and the atomic ratio of transition metal to silicon (Met/Si) is at least 0.18, the transition metal/silicon base material establishes an etching selectivity ratio of at least 4 relative to quartz substrate and allows for application of the fluorine-assisted EB defect correction method.

Japanese Patent Application No. 2011-253743 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A light pattern exposure method comprising irradiating a pattern of light to a resist film through a photomask using ArF excimer laser light as the light source, wherein
    the photomask used is such a halftone phase shift mask that it has been irradiated with ArF excimer laser light in a cumulative dose of at least 10 kJ/cm$^2$,
    said halftone phase shift mask comprising a transparent substrate and a pattern of halftone phase shift film of a material comprising a transition metal, silicon, nitrogen and oxygen, and
    said material having an atomic ratio of transition metal to silicon (Met/Si) from 0.18 to 0.25, a nitrogen content of 25 atom % to 50 atom %, and an oxygen content of 5 atom % to 20 atom, except for an outermost surface region extending from the film surface remote from the substrate to a depth of 10 nm.

2. The method of claim 1 wherein the halftone phase shift mask has been treated for defect correction by directing a high-energy radiation beam in a fluorine base gas atmosphere.

3. The method of claim 1 wherein the transition metal is molybdenum.

4. A halftone phase shift mask for use in a light pattern exposure method comprising irradiating a pattern of light to a resist film through the mask using ArF excimer laser light as the light source, said halftone phase shift mask being such that it may be irradiated with ArF excimer laser light in a cumulative dose of at least 10 kJ/cm$^2$,
    said halftone phase shift mask comprising a transparent substrate and a pattern of halftone phase shift film, the pattern being obtained by forming a halftone phase shift film of a material comprising a transition metal, silicon, nitrogen and oxygen on the substrate and patterning the film, and
    said material having an atomic ratio of transition metal to silicon (Met/Si) from 0.18 to 0.25, a nitrogen content of 25 atom % to 50 atom %, and an oxygen content of 5 atom % to 20 atom %, except for an outermost surface region extending from the film surface remote from the substrate to a depth of 10 nm.

5. The mask of claim 4 wherein the transition metal is molybdenum.

6. The mask of claim 4 wherein the transparent substrate is a silicon oxide substrate, and an etching selectivity ratio of at least 4 is established between the halftone phase shift film and the silicon oxide substrate.

7. A halftone phase shift mask blank from which a halftone phase shift mask is prepared, wherein the halftone phase shift mask is used in irradiating a pattern of light to a resist film using ArF excimer laser light as the light source, and the halftone phase shift mask may be irradiated with ArF excimer laser light in a cumulative dose of at least 10 kJ/cm$^2$, said halftone phase shift mask blank comprising a transparent substrate and a halftone phase shift film of a material comprising a transition metal, silicon, nitrogen and oxygen, and said material having an atomic ratio of transition metal to silicon (Met/Si) from 0.18 to 0.25, a nitrogen content of 25 atom % to 50 atom %, and an oxygen content of 5 atom % to 20 atom %, except for an outermost surface region extending from the film surface remote from the substrate to a depth of 10 nm.

8. The blank of claim 7 wherein the transition metal is molybdenum.

9. The blank of claim 7 wherein the transparent substrate is a silicon oxide substrate, and an etching selectivity ratio of at least 4 is established between the halftone phase shift film and the silicon oxide substrate.

\* \* \* \* \*